(12) United States Patent
Ji et al.

(10) Patent No.: US 12,391,118 B2
(45) Date of Patent: Aug. 19, 2025

(54) APPARATUS FOR CONTROLLING DISPLAY OF VEHICLE AND METHOD FOR THE SAME

(71) Applicants: Hyundai Motor Company, Seoul (KR); Kia Corporation, Seoul (KR)

(72) Inventors: Chang Jin Ji, Gwangmyeong-si (KR); Soong Min Chung, Seoul (KR); Young Hyun Jeong, Seoul (KR); Dae Jin An, Seongnam-si (KR)

(73) Assignees: Hyundai Motor Company, Seoul (KR); Kia Corporation, Seoul (KR)

( * ) Notice: Subject to any disclaimer, the term of this patent is extended or adjusted under 35 U.S.C. 154(b) by 0 days.

(21) Appl. No.: 18/512,979

(22) Filed: Nov. 17, 2023

(65) Prior Publication Data

US 2025/0065716 A1   Feb. 27, 2025

(30) Foreign Application Priority Data

Aug. 24, 2023  (KR) .................. 10-2023-0111407

(51) Int. Cl.
*G06F 3/01* (2006.01)
*B60K 35/00* (2006.01)
(Continued)

(52) U.S. Cl.
CPC .............. *B60K 35/00* (2013.01); *G06F 3/017* (2013.01); *G06V 40/20* (2022.01); *G09G 3/002* (2013.01); *H05K 5/0018* (2022.08); *B60K 35/10* (2024.01); *B60K 35/28* (2024.01); *B60K 35/29* (2024.01); *B60K 35/60* (2024.01); *B60K 35/81* (2024.01);
(Continued)

(58) Field of Classification Search
CPC .......................... B60K 35/00; B60K 2360/21; B60K 2360/27; B60K 35/81; B60K 2360/771; B60K 2360/785; B60K 35/28; B60K 35/29; B60K 35/10; B60K 35/60; B60K 2360/23; B60K 2360/175; B60K 2360/1464; B60K 2360/334; B60K 2360/169; B60K 2360/184; B60K 2360/66; G06V 40/20; H05K 5/0018; G06F 3/017; G06F 3/002; G09G 2354/00; G09G 2380/10
See application file for complete search history.

(56) References Cited

U.S. PATENT DOCUMENTS

2004/0189881 A1*  9/2004  Cook ...................... B60R 11/02
                                                    348/837
2014/0237518 A1*  8/2014  Liu .................. H04N 21/43615
                                                    725/75
(Continued)

FOREIGN PATENT DOCUMENTS

KR     20230021219 A    2/2023

*Primary Examiner* — Robert J Michaud
(74) *Attorney, Agent, or Firm* — Slater Matsil, LLP

(57) ABSTRACT

In an embodiment an apparatus includes a case device configured to cover one region of an interior ceiling of a vehicle, a display device arranged between the case device and the interior ceiling, the display device including a display region configured to display at least one image when a first end portion of the case device is in an open position, and a controller configured to control the display device to display the at least one image in the display region, wherein the display device including the display region is arranged on a surface of the case device in a space between the case device and the interior ceiling.

20 Claims, 11 Drawing Sheets

(51) Int. Cl.
  G06V 40/20 (2022.01)
  G09G 3/00 (2006.01)
  H05K 5/00 (2006.01)
  *B60K 35/10* (2024.01)
  *B60K 35/28* (2024.01)
  *B60K 35/29* (2024.01)
  *B60K 35/60* (2024.01)
  *B60K 35/81* (2024.01)

(52) U.S. Cl.
  CPC .......................... *B60K 2360/1464* (2024.01); *B60K 2360/169* (2024.01); *B60K 2360/175* (2024.01); *B60K 2360/184* (2024.01); *B60K 2360/21* (2024.01); *B60K 2360/23* (2024.01); *B60K 2360/27* (2024.01); *B60K 2360/334* (2024.01); *B60K 2360/66* (2024.01); *B60K 2360/771* (2024.01); *B60K 2360/785* (2024.01); *G09G 2354/00* (2013.01); *G09G 2380/10* (2013.01)

(56) References Cited

U.S. PATENT DOCUMENTS

| | | | |
|---|---|---|---|
| 2015/0219895 A1* | 8/2015 | Laycock | G02B 27/0101 |
| | | | 359/737 |
| 2019/0079717 A1* | 3/2019 | Lee | B60K 35/10 |
| 2021/0162931 A1* | 6/2021 | Bruegl | F16M 11/2028 |
| 2023/0039608 A1 | 2/2023 | Ji et al. | |

\* cited by examiner

APPARATUS FOR CONTROLLING DISPLAY OF VEHICLE AND METHOD FOR THE SAME

CROSS-REFERENCE TO RELATED APPLICATIONS

This application claims the benefit of Korean Patent Application No. 10-2023-0111407, filed on Aug. 24, 2023, which application is hereby incorporated herein by reference.

TECHNICAL FIELD

The present disclosure relates to an apparatus for controlling a display of a vehicle and a method for the same.

BACKGROUND

As autonomous vehicle development has increased, various technologies on autonomous driving have been developed. The autonomous driving may be classified into "Partial Driving Automation", "Conditional Driving Automation", "High Driving Automation", and/or "Full Driving Automation", depending on the control levels of the autonomous driving.

Meanwhile, as a technology such as autonomous driving control or smart cruise control is developed, an available time of a user inside a vehicle has been gradually increased. Accordingly, technologies on various user experiences to be provided to a user inside the vehicle need to be developed.

For example, the user inside the vehicle may want to experience various types of media for a video. Accordingly, a device or a method for reproducing (or displaying) video media to the user may be required to be optimized by sufficiently considering the convenience and the needs of the user.

SUMMARY

The present disclosure relates to an apparatus for controlling a display of a vehicle and a method for the same, and more particularly to a technology of displaying an image through a display of a vehicle.

An embodiment of the present disclosure can solve the above-mentioned problems occurring in the prior art while advantages achieved by the prior art are maintained intact.

An embodiment of the present disclosure provides an apparatus for controlling a display of a vehicle, which is capable of including a case device to cover one region of an interior ceiling of a vehicle and a display device interposed between the case device and the interior ceiling.

An embodiment of the present disclosure provides an apparatus for controlling a display of a vehicle, capable of providing a video including at least one image to a user by using a display region of the display.

An embodiment of the present disclosure provides an apparatus for controlling a display of a vehicle, in which one end portion of a case device is provided to be bent toward the interior ceiling, such that a user is prevented from recognizing a bent region or the visibility of the user for a portion of the display device is lowered.

An embodiment of the present disclosure provides an apparatus for controlling a display of a vehicle and capable of displaying at least one image for a user using a display region serving as a display device.

An embodiment of the present disclosure provides an apparatus for controlling a display of a vehicle, in which at least one image is projected in a display region including a component (e.g., a diffuser film) having a higher reflectance index using a projecting device (e.g., a beam projector), and displaying, for a user, at least one image projected onto a reflecting device (e.g., a reflectorized glass and/or an optical lens) adjacent to the projecting device and provided a display on at least a portion of the interior ceiling.

An embodiment of the present disclosure provides an apparatus for controlling a display of a vehicle and capable of controlling a case device, such that a user distinguishes between a display region and/or a reflecting device, by rolling and unrolling or folding and unfolding the case device.

An embodiment of the present disclosure provides an apparatus for controlling a display of a vehicle and capable of controlling the opening/closing of a case device and/or the operation of a display device, based on information of a gesture of a user (e.g., at least one occupant inside a vehicle), which is recognized through a camera.

An embodiment of the present disclosure provides an apparatus for controlling a display of a vehicle and capable of displaying at least one image, which is reproduced by an external device (e.g., at least one of a mobile terminal, a tablet personal computer, or the combination thereof), on a display region, by performing a pairing operation with the external device corresponding to a user.

An embodiment of the present disclosure provides an apparatus for controlling a display of a vehicle and capable of deactivating (or terminating) a display operation of at least one image, when an emergency situation is sensed as occurring when a vehicle is driving, based on an autonomous driving control operation.

Technical problems to be solved by embodiments of the present disclosure are not necessarily limited to the aforementioned problems, and any other technical problems not mentioned herein can be clearly understood from the following description by those skilled in the art to which the present disclosure pertains.

According to an embodiment of the present disclosure, an apparatus for controlling a display of a vehicle may include a case device provided to cover one region of an interior ceiling of the vehicle, a display device interposed between the case device and the interior ceiling and including a display region to display at least one image, when one end portion of the case device is open, and a controller to control the display device to display the at least one image by using the display region of the display device.

According to an embodiment, the controller may display the at least one image through a display device including the display region, when the one end portion of the case device is open. According to an embodiment, the one end portion of the case device may be provided to be bent in a direction facing the interior ceiling. According to an embodiment, the display device may include an auxiliary display disposed at one region of the one end portion, to display at least one of driving information, battery information, or weather information of the vehicle, or a combination of the driving information, the battery information or the weather information through the auxiliary display.

According to an embodiment, the controller may control another end portion opposite to the one end portion of the case device and coupled to one point of the interior ceiling in a direction closer to or away from a user, based on receiving a user input for controlling a position of the display device.

According to an embodiment, the apparatus may further include at least one projecting device, and the controller may project the at least one image onto the display region by using the at least one projecting device.

According to an embodiment, the controller may project the at least one image onto a diffuser film included in the display region, through the at least one projecting device.

According to an embodiment, the controller may project the at least one image onto at least one door glass through the at least one projecting device, based on receiving a user input for displaying through the at least one door glass of the vehicle, and drop transparency of a discolored film provided on the at least one door glass.

According to an embodiment, the apparatus may further include a reflecting device provided in at least a portion of the interior ceiling to reflect the at least one image projected onto the display region, such that the at least one image is displayed toward an inner portion of the vehicle.

According to an embodiment, the reflecting device may include at least one of reflectorized glass, an optical lens, or a combination of the reflectorized glass or the optical lens to reflect the at least one image, which is projected onto the display region, toward the inner portion.

According to an embodiment, the apparatus may further include a driving device to be connected to one region of the case device, and the controller may control opening and closing of the case device through the driving device, based on receiving a user input for an operation of the display device.

According to an embodiment, the controller may control the opening and the closing of the case device by rolling and unrolling the case device or folding and unfolding the case device, based on receiving the user input for the operation of the display device.

According to an embodiment, the apparatus may further include at least one camera, and the controller may identify a gesture of a user inside the vehicle through the at least one camera, and control at least one of opening or closing of the case device, an operation of the display device, or combination of the opening or closing of the case device and the operation of the display device, based on the identified gesture.

According to an embodiment, the controller may display at least one image, which is reproduced on at least one external device corresponding to a user, on the display region by performing a pairing operation with the at least one external device.

According to an embodiment, the controller may deactivate an operation for displaying the at least one image, when an emergency situation is sensed during autonomous driving of the vehicle.

According to an embodiment of the present disclosure, a method for controlling a display of a vehicle, includes opening, by a controller, one end portion of a case device provided to cover one region of an interior ceiling of the vehicle by using a driving device, based on receiving a user input for an operation of a display device, and displaying, by the controller, at least one image corresponding to the user input, by using a display region included in the display device.

According to an embodiment, the opening, by the controller, of the one end portion of the case device may include opening, by the controller, the case device by unrolling the case device or unfolding the case device, based on receiving the user input.

According to an embodiment, the displaying, by the controller, of the at least one image may include projecting, by the controller, the at least one image onto a diffuser film included in the display region, through the at least one projecting device, and reflecting, by the controller, the at least one image projected onto the display region such that the at least one image is displayed toward an inner portion of the vehicle through a reflecting device provided in at least a portion of the interior ceiling.

According to an embodiment, the method for controlling the display of the vehicle may further include displaying, by the controller, at least one image, which is reproduced on at least one external device corresponding to a user, on the display region by performing a pairing operation with the at least one external device.

According to an embodiment, the method for controlling the display of the vehicle may further include deactivating, by the controller, an operation for displaying the at least one image, when an emergency situation is sensed during autonomous driving of the vehicle.

BRIEF DESCRIPTION OF THE DRAWINGS

The above and other features and advantages of the present disclosure can be more apparent from the following detailed description taken in conjunction with the accompanying drawings, in which.

DETAILED DESCRIPTION OF ILLUSTRATIVE EMBODIMENTS

Figure 1:
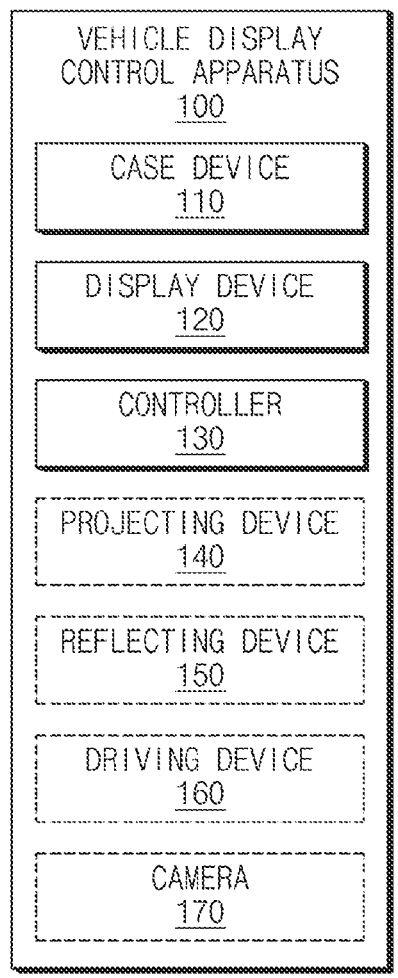
FIG. 1 is a block diagram illustrating components of an apparatus for controlling a display of a vehicle, according to an embodiment of the present disclosure.

Hereinafter, some embodiments of the present disclosure will be described in detail with reference to accompanying drawings. In the following description, the same reference numerals can be assigned to the same components even though the components are illustrated in different drawings. In addition, in the following description of embodiments of the present disclosure, a detailed description of well-known features or functions can be omitted to not unnecessarily obscure the gist of the present disclosure.

In describing components of embodiments according to the present disclosure, terms such as "first", "second", "A", "B", "(a)", "(b)", and the like may be used. The terms can be used merely to distinguish relevant elements from other elements, and the nature, the order, or the sequence of the relevant elements is not necessarily limited to the terms. In addition, unless otherwise defined, all terms used herein, including technical or scientific terms, can have the same meanings as those generally understood by those skilled in the art to which the present disclosure pertains. Such terms as those defined in a generally used dictionary can be interpreted as having meanings equal to the contextual meanings in the relevant field of art, and should not be interpreted as having ideal or excessively formal meanings unless clearly defined as having such in the present application.

Hereinafter, embodiments of the present disclosure will be described in detail with reference to FIGS. 1 to 10.

FIG. 1 is a block diagram illustrating components of an apparatus for controlling a display of a vehicle according to an embodiment of the present disclosure.

According to an embodiment, an apparatus (hereinafter, a vehicle display control apparatus) 100 for controlling a display of a vehicle may include a case device 110, a display device 120, a controller 130, a projecting device 140, a reflecting device 150, a driving device 160, a camera 170, or the combination thereof. The configuration of the vehicle display control apparatus 100 illustrated in FIG. 1 is provided for illustrative purposes, and an embodiment of the present disclosure is not necessarily limited thereto. For example, the vehicle display control apparatus 100 may further include other components (e.g., an interface, a communication device, a memory, a sensor device, or the combination thereof) not illustrated in FIG. 1. For example, the vehicle display control apparatus 100 may not include at least some of components illustrated in FIG. 1.

According to an embodiment, the case device 110 may be provided to cover one region of an interior ceiling of the vehicle.

For example, the case device 110 may include an empty space formed between one surface of the case device 110 and one region of an interior ceiling. For example, at least some components of the display device 120 may be received (or mounted) in the empty space formed.

For example, the case device 110 may have one end portion movable up or down. As the case device 110 moves, at least some components of the display device 120, which are mounted inside the case device 110, may be exposed to the outside of the case device 110.

For example, the one end portion of the case device 110 may be provided to be bent toward the interior ceiling. For example, an auxiliary display may be provided in at least one region of one surface of the case device 110, which faces an outside of the case device 110, of the bent region of the case device 110. The auxiliary display may display at least one of driving information, battery information, or weather information of the vehicle, or a combination thereof, under, for example, the control of the controller 130.

For example, the case device 110 may include one end portion movable and another end portion opposite to the one end portion. For example, the other end portion may be mechanically linked to a point of the interior ceiling. For example, the other end portion may move in a direction (for example, a forward direction or a rearward direction from the user) closer to or away from a user facing the display device 120 under the control of the controller 130 and/or the control of the driving device 160. As the other end portion of the case device 110 moves, even the display region of the display device 120 may move together.

According to an embodiment, the display device 120 may include at least one component to display at least one image for a user.

For example, the display device 120 may be interposed between the case device 110 and the interior ceiling of the vehicle. For example, the display region included in the display device 120 may be provided inside the case device 110 (or on one surface of the case device 110 in a space between the case device 110 and the interior ceiling).

For example, when the one end portion of the case device 110 is open, the display device 120 may display, for the user, at least one image through the display region. In other words, when the one end portion of the case device 110 is open, the display region of the display device 120 may be exposed to the user. For example, when the one end portion of case device 110 is closed, the display region may be hidden between the case device 110 and the interior ceiling without being exposed to the outside.

For example, the display device 120 may further include an auxiliary display. For example, the auxiliary display may be provided in one region of the one end portion of the case device 110. The one region of the one end portion of the case device 110 may be any specific region of the one end portion of the case device 110 provided to be bent toward the interior ceiling.

For example, the display device 120 may further include the display. In other words, the display region included in the display device 120 may refer to one region for displaying an image projected through a beam projection, and/or a display device including a display screen built in the display device.

For example, when the display device 120 displays, for the user, content through a display region in which the display device is provided, at least a portion of the display device 120 and/or at least a portion of the display device may be realized in a rollable structure and/or foldable structure, such that the at least a portion of the display device 120 and/or the at least a portion of the display device may be rolled/unrolled or folded/unfolded.

For example, when the display device 120 displays, for the user, content through a display region in which the display device is provided, a device (for example, a light control film (LCF)) to transmit light may be provided in at least a portion of the display region. In this case, the one end portion of the case device 110 may not be provided to be bent toward the interior ceiling. In other words, according to an embodiment in which the device for light transmitting control is provided in at least a portion of the display region, the one end portion of the case device 110 may be provided in a planar form without being bent.

According to an embodiment, the controller 130 may be operatively connected to the case device 110, the display device 120, the projecting device 140, the reflecting device 150, the driving device 160, the camera 170, or any combination thereof. For example, the controller 130 may control the operations of the case device 110, the display device 120, the projecting device 140, the reflecting device 150, the driving device 160, the camera 170, or any combination thereof.

For example, the controller 130 may display at least one image using the display region of the display device 120.

For example, the controller 130 may display, for the user, at least one image by using the display device includes in the display region. The controller 130 may open one end portion of the case device 110 using the driving device 160, such that the display region is exposed to the user.

For example, the controller 130 may display at least one of driving information, battery information, or weather information of the vehicle, or the combination thereof, through the auxiliary display of the display device 120.

For example, the controller 400 may move the other end portion of the case device 110, which is coupled to the interior ceiling and opposite to the one end portion of the case device 110, in the direction (for example, a forward direction or a rearward direction from the user) closer to or away from the user facing the display device 120, based on receiving a user input for controlling the position of the display device 120.

For example, the controller 130 may project at least one image onto the display region, by using the projecting device 140. The projecting device 140 may include a plurality of projection devices, as a system, for example. For example, a plurality of projecting devices 140 may be provided inside the vehicle. The controller 130 may independently control each of the plurality of projecting devices 140.

For example, the controller 130 may project at least one image onto one component (e.g., the diffuser film) included in the display region using the projecting device 140.

For example, the controller 130 may project at least one image onto at least one door glass through the projecting device 140, based on receiving the user input for displaying using at least one door glass of the vehicle. In this case, the controller 130 may control to more clearly display at least one image projected onto the door glass by degrading, decreasing, or changing the transparency of a discolored film provided in the at least one door glass. The at least one door glass may be glass based on at least one of a polymer dispersed liquid crystal (PDLC), suspended particle devices (SPD), or electrochromic (EC), for example.

For example, the controller 130 may control the opening/closing of the case device 110 by rolling and unrolling or folding and unfolding the case device 110, based on receiving the user input for the operation of the display device 120.

For example, the controller 130 may generate a control command for the opening/closing of the case device 110 or the operation of the display device 120, based on information of a gesture of the user.

For example, the controller 130 may identify the gesture of the user inside the vehicle by using a camera 170, or may control at least one of the opening/closing of the case device 110, the operation of the display device 120, or the combination thereof, based on the identified gesture.

For example, the controller 130 may display, on the display region, at least one image reproduced in at least one external device, by performing a pairing with the at least one external device (e.g., at least one of a mobile terminal, a tablet PC, a notebook, or a combination thereof) corresponding to a user. The display region may be the display device in itself instead of the diffuser film.

For example, the controller 130 may deactivate (terminate) the display operation of at least one image, when an emergency situation is sensed during self-driving of the vehicle.

For example, the controller 130 may identify current driving information of the vehicle, and may monitor whether an emergency situation occurs, when determining the driving as being based on autonomous driving control.

For example, the controller 130 may deactivate the display operation of at least one image, when an emergency situation (e.g., another vehicle, a pedestrian, or a possibility of a collision with an external object including a road structure) is determined as occurring during autonomous driving of the vehicle.

For example, at least a portion of a user input (e.g., a user input for controlling a position of the display device 120, a user input for displaying using at least one door glass, a user input for the operation of the display, or combinations thereof) may include an input received through input devices provided in various types.

For example, various types of input devices may include a user interface (e.g., a mechanical button, a touch screen to receive a touch input, or a combination thereof) provided in one region of a seat taken by a user.

According to an embodiment, the projecting device 140 may be provided inside the vehicle, and at least one image may be projected onto a specific region. For example, the display device 140 may further include a plurality of projecting devices. For example, the projecting device to project an image onto the door glass may include at least one projecting device distinguished separately from the projecting device that projects the image onto the diffuser sheet of the display region.

According to an embodiment, a reflecting device 150 may be provided in the at least a portion of the interior ceiling of the vehicle. For example, the at least one image projected onto (e.g., the diffuser sheet) the display region of the display device 120 may be displayed toward the reflecting device 150. For example, the reflecting device 150 may reflect at least one image projected onto the display region such that the image is displayed toward the interior of the vehicle. For example, the reflecting device 150 may include at least one of a reflectorized glass, an optical lens, or a combination thereof, provided to reflect the at least one image, which is projected onto the display region, toward the interior.

According to an embodiment, a driving device 160 may control the driving of the at least a portion (e.g., the case device 110) of components of the vehicle display control apparatus 100. For example, the driving device 160 may be mechanically coupled to one region (e.g., one region of the opposite end) of the case device 110. For example, the driving device 160 may control the opening/closing of the case device 110 by performing a rolling operation or an unrolling operation for the one end portion of the case device 110. For example, the driving device 160 may expose, to the user, the display region of the display device and/or the reflecting device 150 as the case device 110 is open by unrolling the one end portion of the case device 110 in a direction opposite to the direction of the other end portion.

For example, the driving device 160 may hide the display region of the display device and/or the reflecting device 150 from the visible region of the user, as the case device 110 is closed by rolling the one end portion of the case device 110 in a direction opposite to the direction of the other end portion. For example, the driving device 160 may control the opening/closing of the case device 110 by performing a folding operation or an unfolding operation with respect to the one end portion of the case device 110.

For example, the driving device 160 may expose, to the user, the display region of the display and/or the reflecting device 150, as the case device 110 is open by unfolding the one end portion of the case device 110 in a direction opposite to the direction in which the interior ceiling is positioned. For example, the driving device 160 may hide the display region of the display device and/or the reflecting device 150 from the visible region of the user, as the case device 110 is closed by folding the one end portion of the case device 110 in the direction opposite to the direction in which the interior ceiling is positioned.

According to an embodiment, a camera 170 may be mounted inside the vehicle (e.g., the camera 170 may be mounted in one region of a headrest of a seat in front of a seat taken by a user and/or an upper region of a pillar interposed between seats).

For example, the camera 170 may identify the gesture of the user. The controller 130 may control at least one of the opening/closing of the case device 110, the operation of the display device 120, or the combination thereof, based on the identified gesture.

The configuration of the vehicle display control apparatus 100 illustrated in FIG. 1 is provided for illustrative purposes, and an embodiment of the present disclosure is not necessarily limited thereto. For example, the vehicle display control apparatus 100 may further include a memory and/or a communication device.

According to an embodiment, memory may store a command or data. For example, memory may store at least one instruction allowing the vehicle display control apparatus 100 to perform various operations when the instructions are executed by the controller 130.

For example, memory may be implemented in one-chip set form integrated with the controller 130. The controller 130 may include at least one a communication processor or modem. A memory of an embodiment may include a plurality of different memory devices, as a system.

According to an embodiment, a communication device may support the establishment of a communication channel (e.g., a wireless communication channel) between the vehicle display control apparatus 100 and an external device (e.g., at least one external device corresponding to a user), and making communication through the established communication channel. For example, the communication device may include at least one communication processor operating independently from the controller 130 (e.g., application processor) to support direct (e.g., wired) communication or wireless communication.

For example, the communication device may include a wireless communication module (e.g., a cellular communication module, a short-range wireless communication module, a global navigation satellite system (GNSS) communication module, or combinations thereof), or a wired communication module (e.g., a local area network (LAN) communication module, a power line communication module, or combinations thereof). A relevant communication module of the mobile communication modules may communicate with an external electronic device over a first network (e.g., a short range communication network such as Bluetooth, a wireless fidelity (Wi-Fi) direct, infrared data association (IrDA), or combinations thereof) or a second network (e.g., a long-distance communication network such as a legacy cellular network, a 5G network, a next-generation network, the Internet, or a computer network (e.g., a local area network (LAN), a wide area network (WAN), or combinations thereof) that are included in the network. Several types of communication modules may be integrated into one component (e.g., a single chip) or may be implemented with mutually different components (e.g., a plurality of chips) as a system. In addition, the communication device may be implemented in the form of a single chip together with the controller 130.

For example, the communication device may transmit or receive various data based on the communication with the external device. For example, the communication device may acquire information on at least one image reproduced by at least one external device, through a pairing function with the at least one external device.

Figure 2:
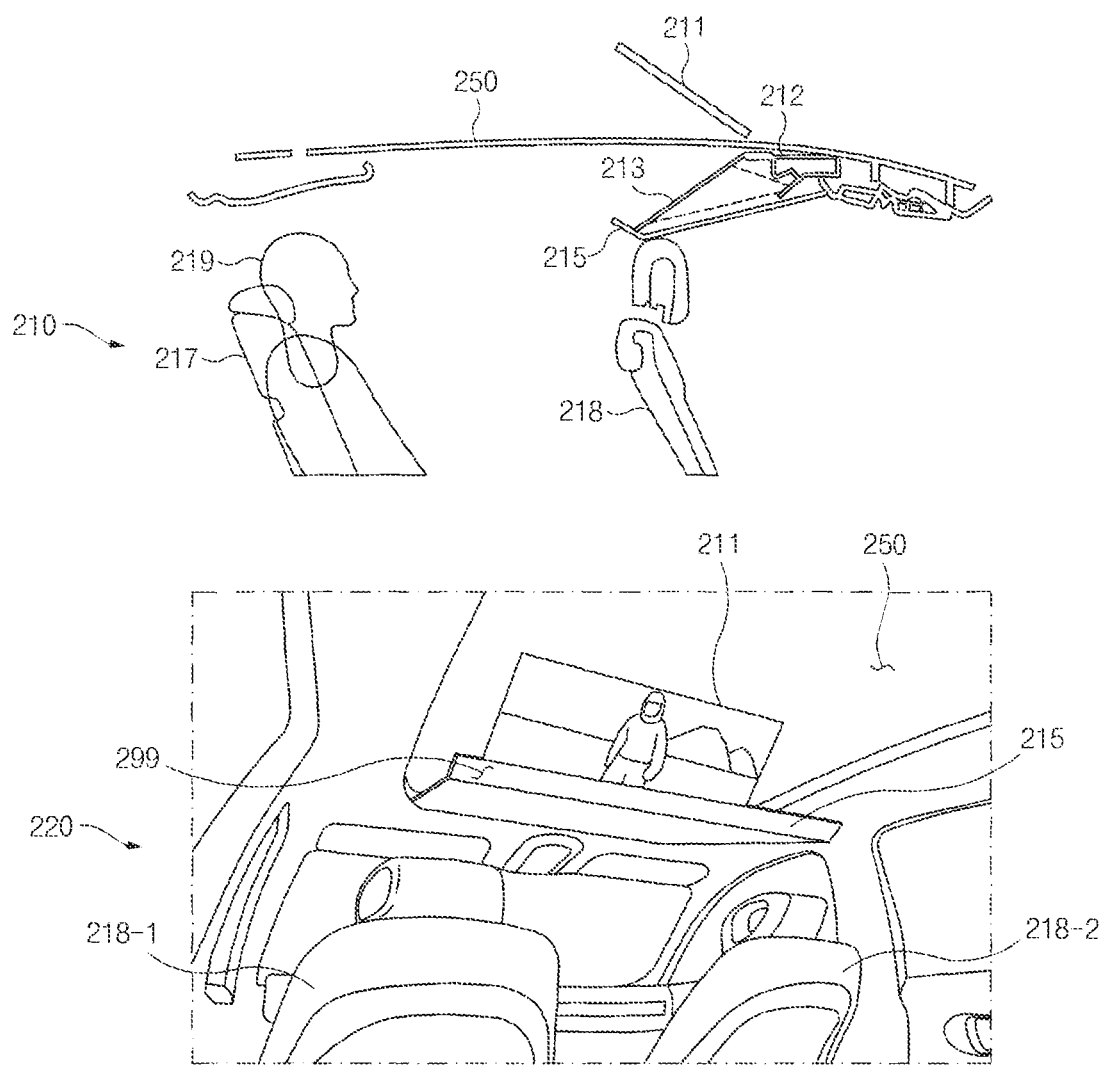
FIG. 2 provides schematic views illustrating an operation of a vehicle display control apparatus according to an embodiment of the present disclosure.

FIG. 2 provides views illustrating an operation of the vehicle display control apparatus, according to an embodiment of the present disclosure.

According to an embodiment, a vehicle display control apparatus (e.g., the vehicle display control apparatus 100 of FIG. 1) may include at least one of a projecting device 212 (e.g., the projecting device 140 of FIG. 1), a display device (e.g., the display device 120 of FIG. 1), a display region 213 included in the display device, a case device 215 (e.g., the case device 110 of FIG. 1), or a combination thereof.

Referring to the view 210 of FIG. 2, according to an embodiment, a user 219 may have a rear seat 217 in a direction facing a front seat 218. For example, the vehicle display control apparatus may open the case device 215 based on a user input for outputting at least one image. For example, the vehicle display control apparatus may open (unfold) the case device 215 as illustrated in view 210, and may project at least one image onto the display region 213 included in the display device using the projecting device 212.

For example, the at least one image projected onto the display region 213 may be displayed for the user through a reflecting device formed in at least a portion of an interior ceiling 250. The reflecting region 211 illustrated in FIG. 2 may be a display region in which at least one image projected is reflected by the reflecting device and reflected in a way that it is optically and visually perceived by the user to be at region 211. For reference, an embodiment illustrated in FIG. 2 may be an embodiment in which the reflecting device corresponds to reflectorized glass.

Referring to view 220 of FIG. 2, according to an embodiment, the vehicle display control apparatus may display at least one image for a user having a seat present in back of a first seat 218-1 and a second seat 218-2.

For example, the vehicle display control apparatus may open a case device 215 provided to cover one region of the interior ceiling 250.

For example, the vehicle display control apparatus 100 may provide, for the user, a screen reflected from the reflective region 211 interposed between the case device 110 and the interior ceiling 250. For example, the screen reflected from the reflective region 211 may be a screen of at least one image output through the display region and reflected through the reflecting device.

For example, one end portion 299 of the case device 215 of the vehicle display control apparatus 100 may be provided to be bent toward the interior ceiling 250.

For example, an auxiliary display may be provided in a partial region of the one end portion 299 of the case device 215. The vehicle display control apparatus 100 may display, for the user, at least one of driving information, battery information, weather information of the vehicle, or a combination thereof, through the auxiliary display.

Figure 3:
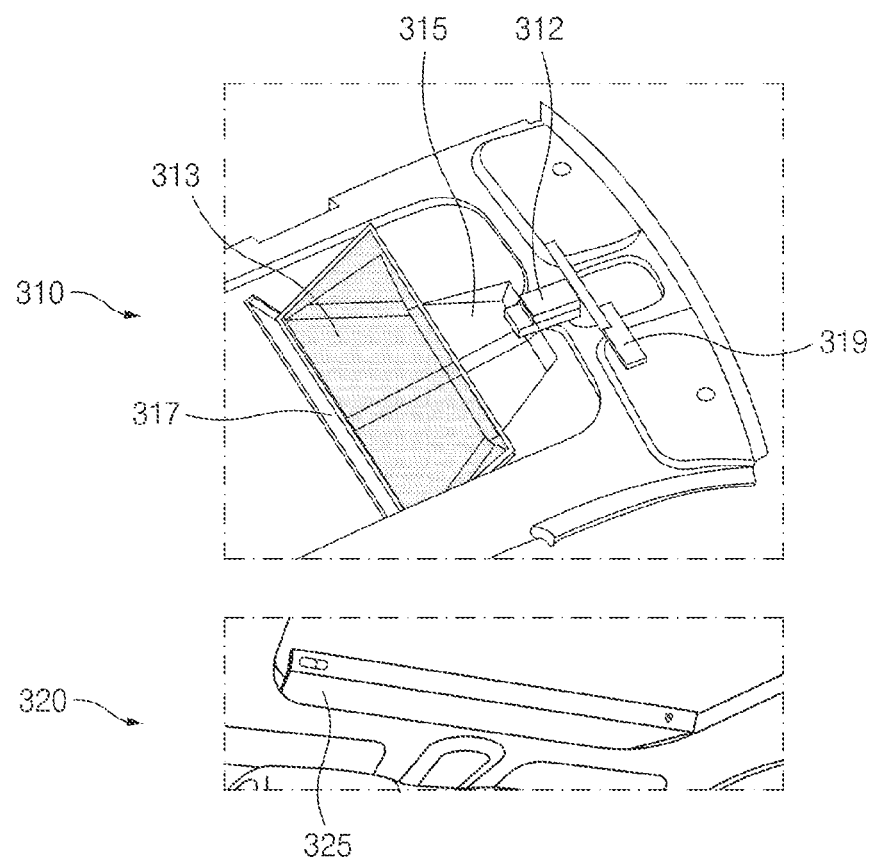
FIG. 3 provides schematic views illustrating an arrangement structure of components of an apparatus for controlling a display of a vehicle, according to an embodiment of the present disclosure.

FIG. 3 provides schematic views illustrating an arrangement structure of components of a vehicle display control apparatus according to an embodiment of the present disclosure.

Referring to view 310 of FIG. 3, according to an embodiment, a vehicle display control apparatus (e.g., the vehicle display control apparatus 100 of FIG. 1) may include at least one of a projecting device 312 (e.g., the projecting device 140 of FIG. 1), a display (e.g., the display device 120 of FIG. 1), a display region 313 (e.g., a diffuser film) included in the display, an auxiliary display 317, a case device 315 (e.g., the case device 110 of FIG. 1), a driving device 319 (e.g., the driving device 160 of FIG. 1), or a combination thereof.

Referring to views 310 and 320 of FIG. 3, according to an embodiment, the vehicle display control apparatus may include an auxiliary display 317 provided in a partial region 325 of one end portion of the case device 315.

Figure 4A:
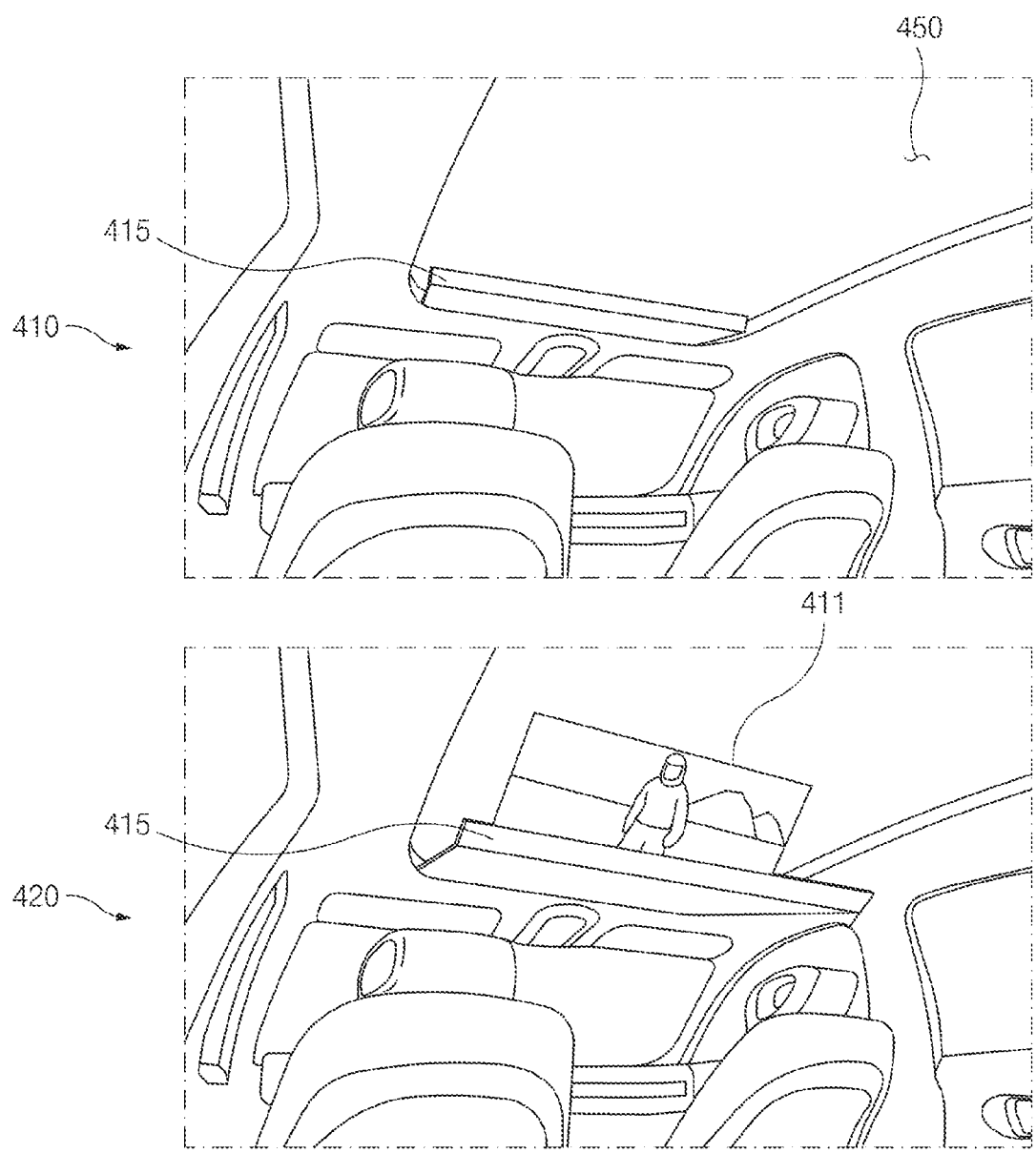
FIG. 4A provides views illustrating a configuration of a vehicle display control apparatus, according to an embodiment of the present disclosure.

FIG. 4A provides views illustrating a configuration of the vehicle display control apparatus, according to an embodiment of the present disclosure.

Referring to view 410 of FIG. 4A, according to an embodiment, the vehicle display control apparatus (e.g., the vehicle display control apparatus 100 of FIG. 1) may close a case device 415 (e.g., the case device 110 of FIG. 1) using a driving device (e.g., the driving device 160 of FIG. 1).

For example, the vehicle display control apparatus may close the case device 110 by rolling one end portion of the case device 415 in the first direction facing another end portion opposite to the one end portion, such that components provided inside the case device 110 are hidden from the visible region of the user.

Referring to view 420 of FIG. 4A, according to an embodiment, the vehicle display control apparatus may open the case device 415 using the driving device.

For example, the vehicle display control apparatus may open the case device 415 by unrolling one end portion of the case device 415 in a second direction opposite to the first direction, such that the at least one image displayed through the display region is reflected from the reflective region 411 to provide the reflected screen to the user. For reference, the reflective region 411 illustrated in FIG. 4A may be a reflected region when the reflecting device includes reflectorized glass.

Figure 4B:
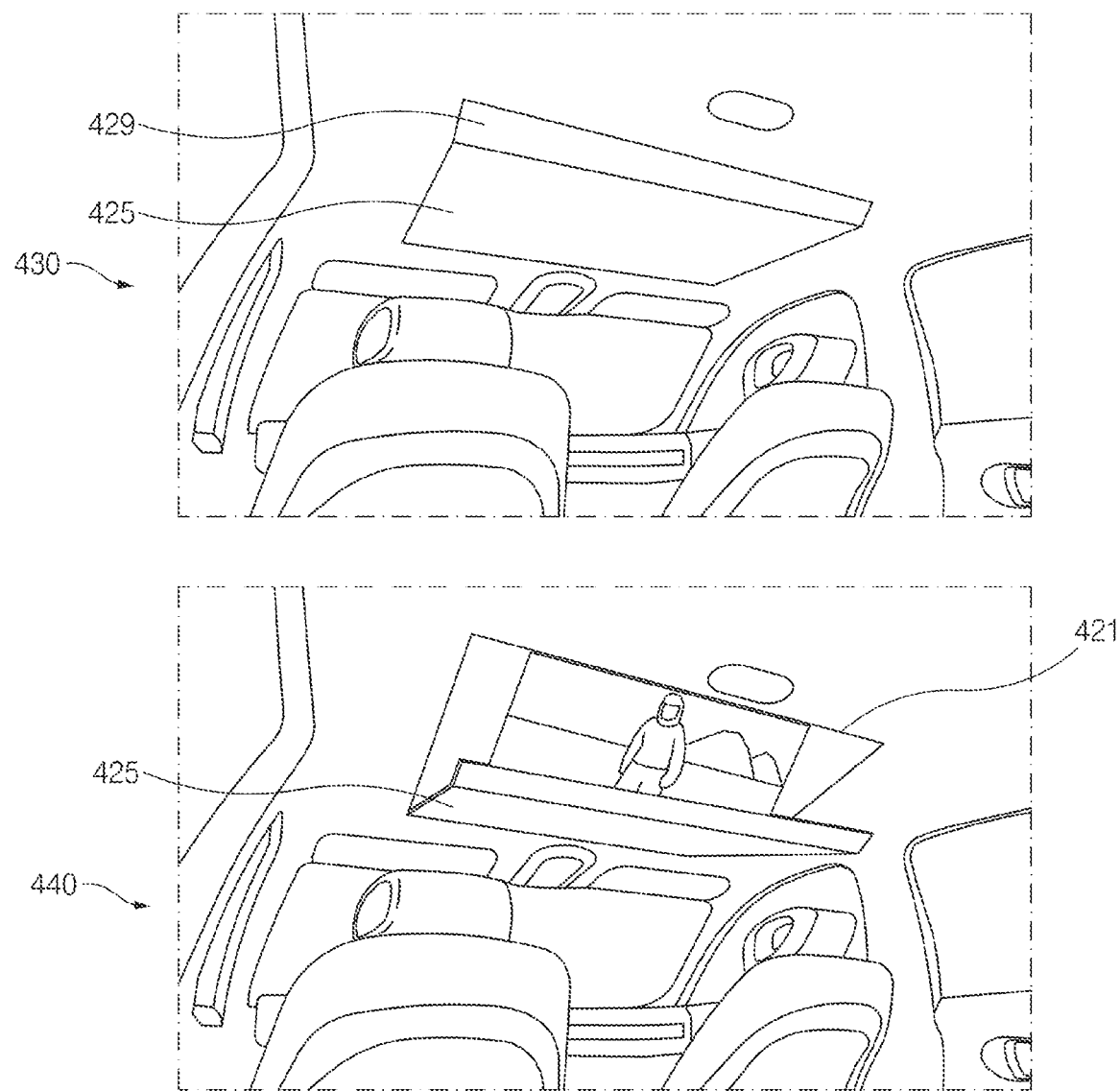
FIG. 4B provides views illustrating a configuration of a vehicle display control apparatus, according to an embodiment of the present disclosure.

FIG. 4B provides views illustrating a configuration of the vehicle display control apparatus according to an embodiment of the present disclosure.

Referring to view 430 of FIG. 4B, according to an embodiment, the vehicle display control apparatus (e.g., the vehicle display control apparatus 100 of FIG. 1) may close a case device 425 (e.g., the case device 110 of FIG. 1) using a driving device (e.g., the driving device 160 of FIG. 1).

For example, the vehicle display control apparatus may close the case device 425 by folding one end portion 429 of the case device 425 in a third direction facing the interior ceiling 450, such that components provided inside the case device 425 are hidden from the visible region of the user.

Referring to view 440 of FIG. 4B, according to an embodiment, the vehicle display control apparatus may open the case device 425 using the driving device.

For example, the vehicle display control apparatus may open the case device 425 by unrolling or tilting one end portion of the case device 425 in a fourth direction opposite to the third direction, such that the at least one image displayed through the display region is reflected from the reflective region 421 to provide the reflected screen to the user. For reference, the reflective region 421 illustrated in FIG. 4B may be the reflected region when the reflecting device includes an optical lens.

Figure 5:
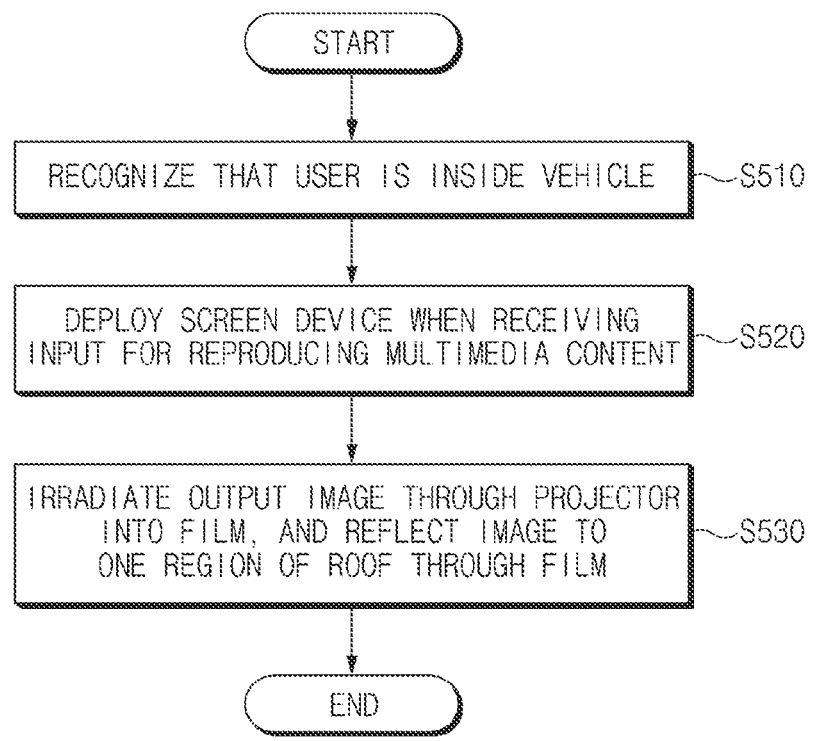
FIG. 5 is a flowchart illustrating a vehicle display control method, according to an embodiment of the present disclosure.

FIG. 5 is a flowchart illustrating a vehicle display control method according to an embodiment of the present disclosure.

According to an embodiment, the vehicle display control apparatus (e.g., the vehicle display control apparatus 100 of FIG. 1) may perform the operations disclosed in FIG. 5. For example, at least a portion of components (e.g., the case device 110, the display device 120, the controller 130, the projecting device 140, the reflecting device 150, the driving device 160, the camera 170, or a combination thereof) included in the vehicle display control apparatus of an embodiment may be used for the operations of the method embodiment.

According to an embodiment, operations of S510 to S530 may be sequentially performed, but are not necessarily sequentially performed. For example, the sequence of the operations may be changed, or at least two operations may be performed in parallel. In addition, in the following description made with reference to FIG. 5, the description corresponding to the above description or the duplication of the above description of embodiments may be described in brief or omitted.

According to a method embodiment, the vehicle display control apparatus may recognize that a user is inside a vehicle (operation S510).

For example, the vehicle display control apparatus may recognize that the user is inside the vehicle by using a camera.

According to an embodiment, the vehicle display control apparatus may deploy a screen device when receiving an input for reproducing multimedia content (operation S520).

For example, the vehicle display control apparatus may receive a user input including a command for reproducing at least one image including the multimedia content.

For example, the vehicle display control apparatus may expose, to a user, at least a portion of components provided between the case device and the interior ceiling, by deploying (or opening) the case device included in the screen device, when receiving the user input.

According to an embodiment, the vehicle display control apparatus may irradiate an output image through a projector into/onto a film, and may reflect the image to one region of a roof through the film (operation S530).

For example, the vehicle display control apparatus may irradiate (project) at least one image to the film (or the display region) through at least one beam projector (or the projecting device) provided inside the vehicle.

For example, the at least one image displayed through the film may be reflected to the one region (e.g., the reflectorized glass and/or the optical lens) of the roof (e.g., the interior ceiling). The reflected image may be provided to the user within the visible region of the user.

Figure 6:
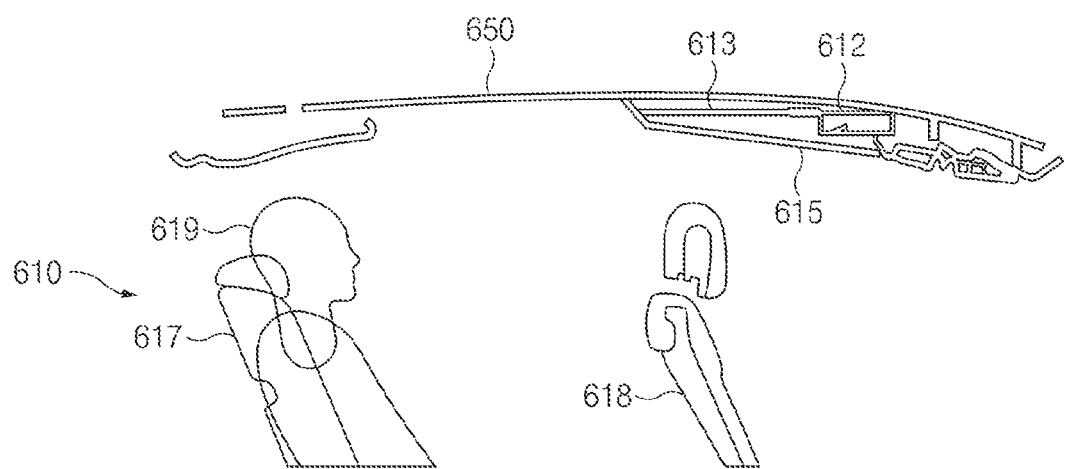
FIG. 6 provides schematic views illustrating an operation of a vehicle display control apparatus, according to an embodiment of the present disclosure.
Figure 6:
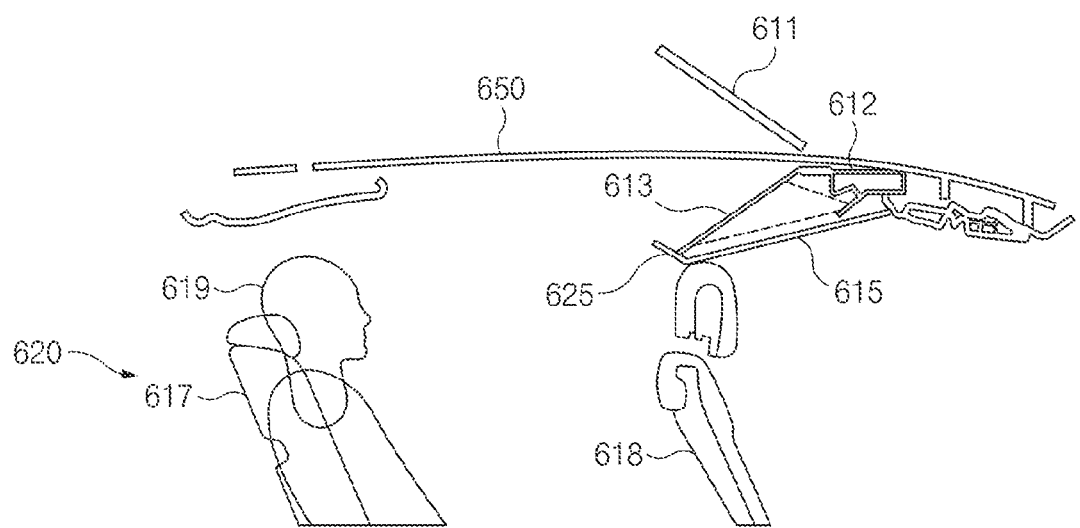

FIG. 6 provides schematic views illustrating the operation of the vehicle display control apparatus according to an embodiment of the present disclosure.

According to an embodiment, a vehicle display control apparatus (e.g., the vehicle display control apparatus 100 of FIG. 1) may include at least one of a projecting device 612 (e.g., the projecting device 140 of FIG. 1), a display device (e.g., the display device 120 of FIG. 1), a display region 613 included in the display device, a case device 615 (e.g., the case device 110 of FIG. 1), or a combination thereof.

Referring to view 610 of FIG. 6, according to an embodiment, the vehicle display control apparatus may close the case device 615 to hide components of the vehicle display control apparatus from the visible region of the user 619.

Referring to view 620 of FIG. 6, according to an embodiment, a user 619 may have a rear seat 617 in a direction facing a front seat 618.

For example, the vehicle display control apparatus may open the case device 615 based on a user input for outputting at least one image. In this case, the vehicle display control apparatus 100 may open the case device 615 by unfolding or tilting the one end portion 625 of the case device 615 toward the headrest of the front sheet 618.

For example, the vehicle display control apparatus may open (unfold) the case device 615, and may project at least one image onto the display region 613 included in the display device using the projecting device 612.

For example, the at least one image projected onto the display region 613 may be displayed for the user through a reflecting device formed in at least a portion of an interior ceiling 650. The reflecting region 611 illustrated in FIG. 6 may be a display region in which at least one image projected is reflected by the reflecting device and reflected (i.e., an optically perceived position 611 from the visual perspective of the user 619). For reference, an embodiment illustrated in FIG. 6 may be an embodiment in which the reflecting device corresponds to reflectorized glass, for example.

Figure 7:
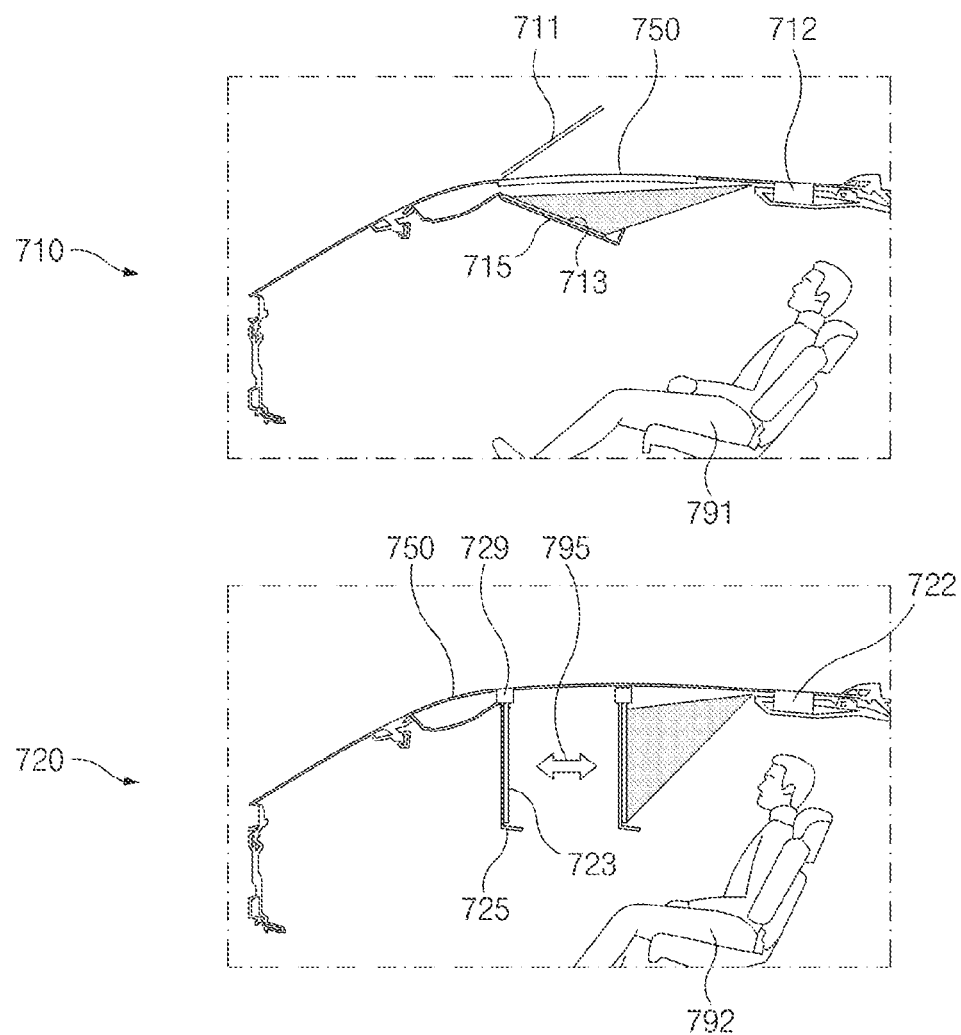
FIG. 7 provides schematic views illustrating an operation of a vehicle display control apparatus, according to an embodiment of the present disclosure.

FIG. 7 provides schematic views illustrating an operation of a vehicle display control apparatus according to an embodiment of the present disclosure.

Referring to view 710 of FIG. 7, according to an embodiment, a vehicle display control apparatus (e.g., the vehicle display control apparatus 100 of FIG. 1) may include at least one of a first projecting device 712 (e.g., the projecting device 140 of FIG. 1), a display device (e.g., the display device 120 of FIG. 1), a display region 713 included in the display device, a first case device 715 (e.g., the case device 110 of FIG. 1), or a combination thereof.

For example, the vehicle display control apparatus may open the case device 715 as illustrated in view 710 of FIG. 7, based on receiving a first user input for outputting at least one image from a first user 791, and may project the at least one image onto the display region 713 included in the display device by using the projecting device 712.

For example, the at least one image projected onto the display region 713 may be displayed for the first user 791 through a reflecting device formed in at least a portion of an interior ceiling 750. The reflecting region 711 illustrated in FIG. 7 may be a display region in which at least one image projected is reflected by the reflecting device and reflected (perceived image position 711 from the visual perspective of the user 791). For reference, an embodiment illustrated in view 710 of FIG. 7 may be an embodiment in which the reflecting device corresponds to reflectorized glass, for example.

Referring to view 720 of FIG. 7, according to an embodiment, a vehicle display control apparatus (e.g., the vehicle display control apparatus 100 of FIG. 1) may include at least one of a second projecting device 722 (e.g., the projecting device 140 of FIG. 2), a display device (e.g., the display device 120 of FIG. 1), a display region 723 included in the display device, a second case device 725 (e.g., the case device 110 of FIG. 1), or a combination thereof. For example, the vehicle display control apparatus may open the case device 725 as illustrated, based on receiving a first user input for outputting at least one image from a second user 792, and may project the at least one image onto the display region 723 included in the display device by using the projecting device 722.

For example, the at least one image projected onto the display region 723 may be displayed for the first user 792. For reference, according to an embodiment illustrated in view 720 of FIG. 7 may be an embodiment in which the display region serves as the display, as provided for illustrative purposes. Accordingly, even when the display region is realized as a component to display an image projected from the beam projector, the vehicle display control apparatus may perform an embodiment illustrated in view 720 of FIG. 7.

For example, the vehicle display control apparatus may move another end portion 729, which is opposite to one end portion of the case device 725 and connected to the interior ceiling 750, in a specific direction 795. Accordingly, the vehicle display control apparatus may move (or control) the display region 723 in a direction 795 closer to or away from the user.

Figure 8:
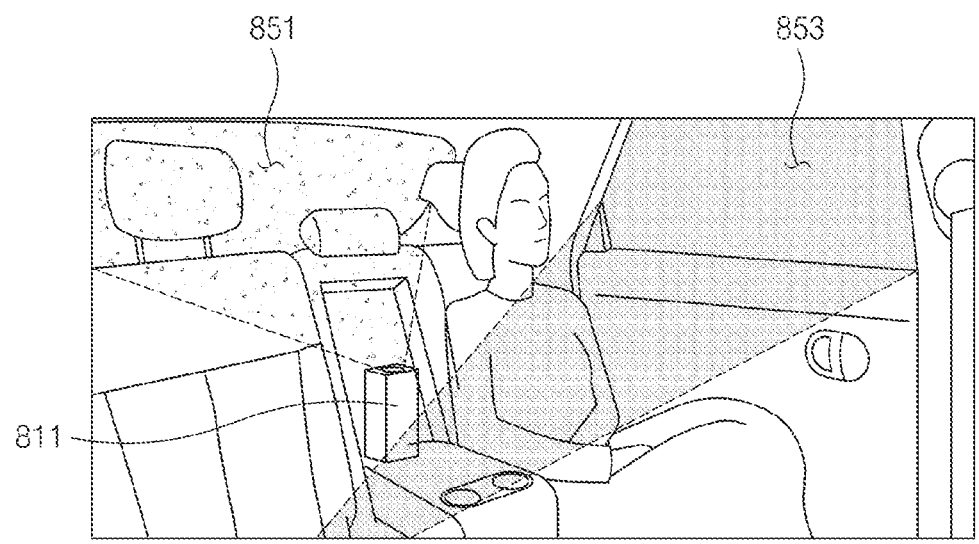
FIG. 8 is a schematic view illustrating an operation of a vehicle display control apparatus, according to an embodiment of the present disclosure.

FIG. 8 is a schematic view illustrating the operation of a vehicle display control apparatus according to an embodiment of the present disclosure.

According to an embodiment, the vehicle display control apparatus (e.g., the vehicle display control apparatus 100 of FIG. 1) may display at least one image for the user using a projecting device (e.g., the projecting device 140 of FIG. 1 and at least one door glass 851 and/or 853).

For example, the vehicle display control apparatus may project at least one image onto a rear door glass 851 of the vehicle by using the first projecting device 811 located at a position different from those of the above-described embodiments.

For example, the vehicle display control apparatus may project at least one image onto a side door glass 853 of the vehicle, by using the first projecting device 811 or a second projecting device (not illustrated) separate from the first projecting device 811.

For example, the vehicle display control apparatus may drop or decrease the transparency of a discolored film provided in at least one door glass 851 or 853. Accordingly, the visibility of the at least one image displayed on the at least one door glass 851 or 853 may be increased.

Figure 9:
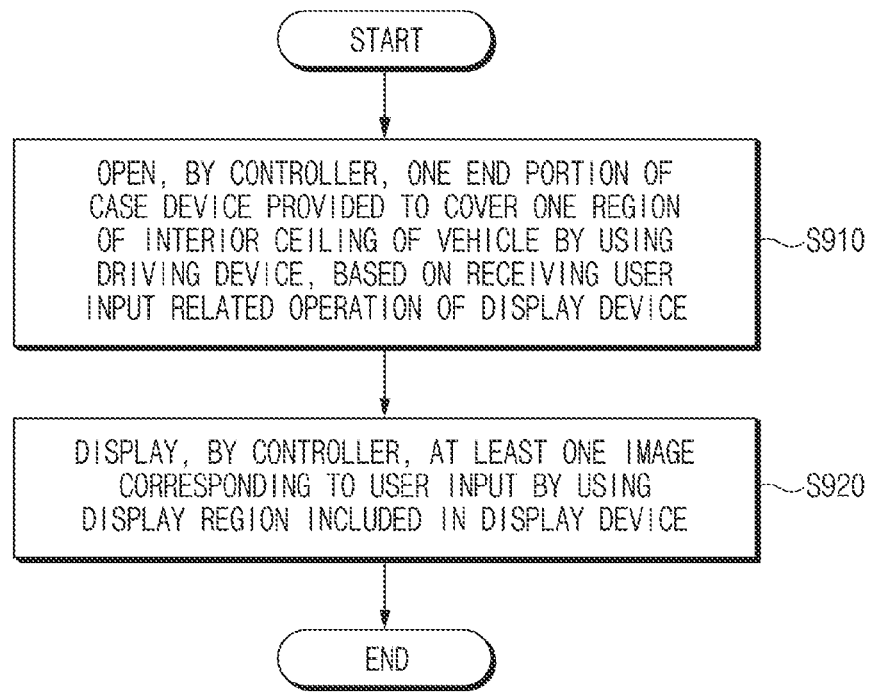
FIG. 9 is a flowchart illustrating a vehicle display control method, according to an embodiment of the present disclosure.

FIG. 9 is a flowchart illustrating a vehicle display control method according to an embodiment of the present disclosure.

According to an embodiment, the vehicle display control apparatus (e.g., the vehicle display control apparatus 100 of FIG. 1) may perform the operations disclosed in FIG. 9. For example, at least some of components (e.g., the case device 110, the display device 120, the controller 130, the projecting device 140, the reflecting device 150, the driving device 160, the camera 170, or a combination thereof, of FIG. 1) constituting the vehicle display control apparatus may be set to perform the operations of FIG. 5.

According to an embodiment, operations of S910 to S920 may be sequentially performed, but are not necessarily sequentially performed. For example, the sequence of the operations may be changed, or at least two operations may be performed in parallel. In addition, in the following description made with reference to FIG. 9, the description corresponding to the above description or the duplication of the above description of embodiments may be described in brief or omitted.

According to an embodiment, the controller may open one end portion of the case device provided to cover one region of an interior ceiling of a vehicle by using a driving device, based on receiving a user input related the operation of the display device (operation S910).

For example, the controller may open the case device by unrolling, tilting, or lowering the one end portion of the case device through the driving device in a direction opposite to another end portion of the case device, or unfolding, tilting, or lowering the one end portion of the case device in a direction opposite to a direction facing the interior ceiling.

According to an embodiment, the controller may display at least one image corresponding to the user input by using the display region included in (or produced by, or reflected by) the display device (operation S920).

For example, the vehicle display control apparatus may display at least one image corresponding to a user input for a user by using a display region and/or a reflective region in which at least one image displayed on the display region is reflected.

Figure 10:
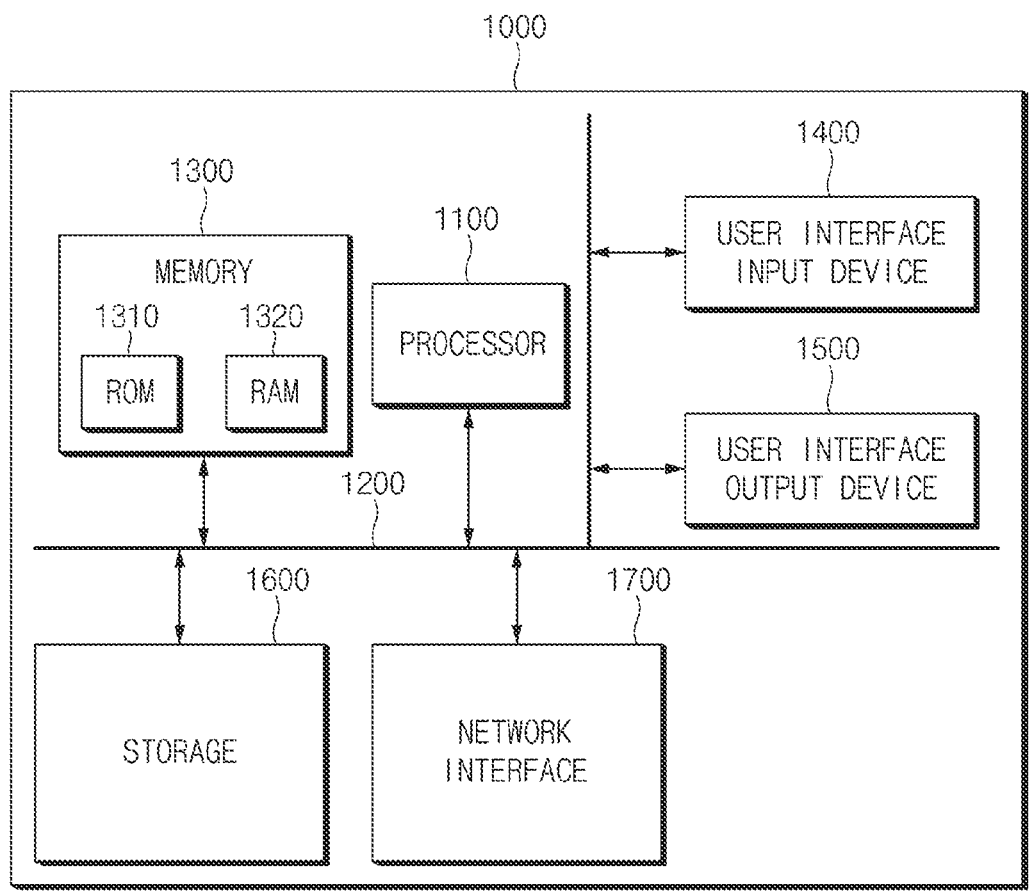
FIG. 10 is a schematic view illustrating a system of a vehicle display control apparatus, according to an embodiment of the present disclosure.

FIG. 10 is a schematic view illustrating a system of the vehicle display control apparatus according to an embodiment of the present disclosure.

Referring to FIG. 10, a computing system 1000 for the vehicle display control method may include at least one processor 1100, memory 1300, a user interface input device 1400, a user interface output device 1500, storage 1600, a network interface 1700, which are connected with each other via a bus 1200.

The processor 1100 may be a central processing unit (CPU) or a semiconductor device for processing instructions stored in memory 1300 and/or storage 1600. Each of the memory 1300 and the storage 1600 may include various types of volatile or non-volatile storage media. For example, the memory 1300 may include a read only memory (ROM) and a random access memory (RAM).

Thus, the operations of the methods or algorithms described in connection with the embodiments disclosed in the present disclosure may be directly implemented with a hardware module, a software module, or a combinations thereof, executed by the processor(s) 1100. The software module may reside on a storage medium (i.e., memory 1300 and/or storage 1600), such as a RAM, a flash memory, a ROM, an erasable and programmable ROM (EPROM), an electrically EPROM (EEPROM), a register, a hard disc, a removable disc, a compact disc-ROM (CD-ROM), or a combination thereof.

The exemplary storage medium may be coupled to the processor 1100. The processor 1100 may read out information from the storage medium and may write information in the storage medium. Alternatively, the storage medium may be integrated with the processor 1100. The processor and storage medium may reside in an application specific integrated circuit (ASIC). The ASIC may reside in a user terminal. Alternatively, the processor and storage medium may reside as separate components of the user terminal.

According to the present disclosure, an apparatus for controlling the display of the vehicle and a method for the same can have the following effects and advantages.

According to at least one embodiment of the present disclosure, an apparatus for controlling a display device, a projecting device, a camera, a driving device, a case device, or a combination thereof, provided in a vehicle may be provided.

In addition, according to at least one embodiment of the present disclosure, in the apparatus for controlling the display of the vehicle and the method for the same, the video is provided through the display device provided at the suitable position allowing the user to view the video in the easy posture, instead of the display to display the video on the rear surface of the headrest of the front seat of the seat taken by the user, can thereby increase the driving satisfaction of the driver.

In addition, according to at least one embodiment of the present disclosure, in the apparatus for controlling the display of the vehicle and the method for the same, interior openness may be increased by following future mobility trends, and various types of visible and/or auditory content may be provided to the user.

Further, according to at least one embodiment of the present disclosure, in the apparatus for controlling the display of the vehicle and the method for the same, the image for the passenger at the rear seat may be output to the inner part of the vehicle, such that an entertainment factor can be increased during the driving.

A variety of effects and advantages, directly or indirectly understood through the present disclosure, may be provided.

The above description is merely an example of technical ideas of the present disclosure, and various modifications and modifications may be made by one skilled in the art without departing from the scope of the present disclosure.

Therefore, the exemplary embodiments of the present disclosure are provided to explain the spirit and scope of the present disclosure, but not to necessarily limit them, so that the spirit and scope of the present disclosure is not necessarily limited by the embodiments. The scope of the present disclosure should be construed on the basis of the accompanying claims, and all technical ideas within scopes equivalent to the claims should be included in the scope of the present disclosure.

Hereinabove, although the present disclosure has been described with reference to exemplary embodiments and the accompanying drawings, the present disclosure is not limited thereto, but may be variously modified and altered by those skilled in the art to which the present disclosure pertains without departing from the spirit and scope of the present disclosure claimed in the following claims.

What is claimed is:

1. An apparatus for controlling a display of a vehicle, the apparatus comprising:
 a case device configured to cover one region of an interior ceiling of the vehicle;
 a display device arranged between the case device and the interior ceiling, the display device including a display region configured to display at least one image when a first end portion of the case device is in an open position; and
 a controller configured to control the display device to display the at least one image in the display region,
 wherein the display device including the display region is arranged on a surface of the case device in a space between the case device and the interior ceiling.

2. The apparatus of claim 1, wherein the controller is further configured to display the at least one image through the display device including the display region.

3. The apparatus of claim 1, wherein the first end portion of the case device is configured to be bent in a direction facing the interior ceiling.

4. The apparatus of claim 1, wherein the display device comprises an auxiliary display disposed at one region of the first end portion, the auxiliary display being configured to display at least one of driving information of the vehicle, battery information of the vehicle, or weather information.

5. The apparatus of claim 1, wherein the controller is further configured to control a second end portion of the case device, the second end portion being opposite to the first end portion, wherein the second end portion is coupled to the interior ceiling and is movable in a direction closer to or farther away from a user, based on receiving a user input for controlling a position of the display device.

6. The apparatus of claim 1, further comprising at least one projecting device, wherein the controller is further configured to project the at least one image onto the display region by using the at least one projecting device.

7. The apparatus of claim 6, wherein the controller is further configured to project the at least one image onto a diffuser film included in the display region, using the at least one projecting device.

8. The apparatus of claim 6, wherein the controller is further configured to:
project the at least one image onto at least one door window using the at least one projecting device, based on receiving a user input for displaying on the at least one door window of the vehicle; and
decrease transparency of a discolored film provided on the at least one door window.

9. The apparatus of claim 6, further comprising a reflecting device provided in at least a portion of the interior ceiling to reflect the at least one image projected onto the display region such that the at least one image is displayed toward an inner portion of the vehicle.

10. The apparatus of claim 9, wherein the reflecting device comprises at least one of reflectorized glass or an optical lens, and wherein the reflecting device is configured to reflect the at least one image, which is projected onto the display region, toward the inner portion.

11. The apparatus of claim 1, further comprising a driving device configured to be connected to one region of the case device, wherein the controller is further configured to control opening and closing of the case device through the driving device, based on receiving a user input for an operation of the display device.

12. The apparatus of claim 11, wherein the controller is further configured to control the opening and the closing of the case device by rolling and unrolling the case device or folding and unfolding the case device, based on receiving the user input for the operation of the display device.

13. The apparatus of claim 1, further comprising at least one camera, wherein the controller is further configured to:
identify a gesture of a user inside the vehicle through the at least one camera, and
control at least one of opening of the case device, closing of the case device, or an operation of the display device, based on the identified gesture.

14. The apparatus of claim 1, wherein the controller is further configured to control the display device to display the at least one image, paired from an external device of a user, on the display region.

15. The apparatus of claim 1, wherein the controller is further configured to deactivate displaying of the at least one image, in response to an emergency situation being sensed during autonomous driving of the vehicle.

16. A method for controlling a display of a vehicle, the method comprising:
opening one end portion of a case device covering one region of an interior ceiling of the vehicle in response to receiving a user input for an operation of a display device; and
displaying at least one image corresponding to the user input using a display region included in the display device,
wherein the display device including the display region is arranged on a surface of the case device in a space between the case device and the interior ceiling.

17. The method of claim 16, wherein opening the one end portion of the case device comprises opening the case device by unrolling the case device or unfolding the case device, in response to receiving the user input.

18. The method of claim 16, wherein displaying of the at least one image comprises:
projecting the at least one image onto a diffuser film included in the display region, using at least one projecting device; and
reflecting the at least one image projected onto the display region such that the at least one image is displayed toward an inner portion of the vehicle through a reflecting device provided in at least a portion of the interior ceiling.

19. The method of claim 16, wherein displaying further includes displaying the at least one image by reproducing an image of at least one external device of a user, on the display region by performing a pairing operation with the at least one external device.

20. The method of claim 16, further comprising deactivating displaying the at least one image, in response to an emergency situation being sensed during autonomous driving of the vehicle.

* * * * *